(12) United States Patent
Szymanowski et al.

(10) Patent No.: US 10,211,784 B2
(45) Date of Patent: Feb. 19, 2019

(54) AMPLIFIER ARCHITECTURE RECONFIGURATION

(71) Applicant: Freescale Semiconductor, Inc., Austin, TX (US)

(72) Inventors: Margaret A. Szymanowski, Chandler, AZ (US); Ramanujam Srinidhi Embar, Gilbert, AZ (US); Roy Mclaren, Gilbert, AZ (US)

(73) Assignee: NXP USA, INC., Austin, TX (US)

( * ) Notice: Subject to any disclaimer, the term of this patent is extended or adjusted under 35 U.S.C. 154(b) by 0 days.

(21) Appl. No.: 15/342,637

(22) Filed: Nov. 3, 2016

(65) Prior Publication Data
US 2018/0123520 A1 May 3, 2018

(51) Int. Cl.
| | |
|---|---|
| *H03F 3/68* | (2006.01) |
| *H03F 1/02* | (2006.01) |
| *H01L 21/48* | (2006.01) |
| *H03F 3/19* | (2006.01) |
| *H03F 3/21* | (2006.01) |
| *H03F 1/32* | (2006.01) |
| *H03F 1/56* | (2006.01) |
| *H03F 3/24* | (2006.01) |

(52) U.S. Cl.
CPC ....... *H03F 1/0288* (2013.01); *H01L 21/4825* (2013.01); *H03F 1/3247* (2013.01); *H03F 1/56* (2013.01); *H03F 3/19* (2013.01); *H03F 3/211* (2013.01); *H03F 3/245* (2013.01); *H03F 2200/222* (2013.01); *H03F 2200/387* (2013.01); *H03F 2200/451* (2013.01); *H03F 2203/21103* (2013.01); *H03F 2203/21106* (2013.01); *H03F 2203/21142* (2013.01)

(58) Field of Classification Search
CPC .......... H03F 1/0288; H03F 3/19; H03F 3/211
USPC ......................... 330/124 R, 295, 286, 53, 54
See application file for complete search history.

(56) References Cited

U.S. PATENT DOCUMENTS

| | | | |
|---|---|---|---|
| 7,071,774 B2 * | 7/2006 | Hellberg | H03F 1/0294 330/124 R |
| 7,078,976 B2 * | 7/2006 | Blednov | H01L 24/49 330/124 R |
| 7,936,007 B2 | 5/2011 | Marchant et al. | |
| 8,314,000 B2 | 11/2012 | Hsieh | |
| 8,593,219 B1 | 11/2013 | Root | |

(Continued)

FOREIGN PATENT DOCUMENTS

| | | |
|---|---|---|
| WO | 2009081341 A1 | 7/2009 |
| WO | 2014023234 A1 | 3/2014 |

*Primary Examiner* — Khanh V Nguyen
*Assistant Examiner* — Khiem Nguyen

(57) ABSTRACT

An amplifier includes first, second, and third inputs to receive an RF signal, first and second amplifiers, and an input phase adjustment circuit coupling the first, second, and third inputs to the first and second amplifiers, the input phase adjustment circuit having first and second outputs coupled to the first and second amplifiers, respectively. The input phase adjustment circuit includes a pair of inputs, where the pair of inputs includes the first and second inputs, for the first output and a pair of phase adjustment paths coupling the pair of inputs to the first output, respectively. The pair of phase adjustment paths are configured to adjust a phase of the RF signal differently for the first output.

19 Claims, 8 Drawing Sheets

(56) References Cited

U.S. PATENT DOCUMENTS

| | | | |
|---|---|---|---|
| 2004/0056723 A1* | 3/2004 | Gotou | H03F 1/0288 330/295 |
| 2012/0187481 A1 | 7/2012 | Mallikarjunaswamy | |
| 2012/0286359 A1 | 11/2012 | Lin et al. | |
| 2013/0265107 A1 | 10/2013 | Holmes | |
| 2014/0077874 A1 | 3/2014 | Ahmed et al. | |

* cited by examiner

US 10,211,784 B2

AMPLIFIER ARCHITECTURE RECONFIGURATION

FIELD OF INVENTION

The present embodiments relate to amplifiers.

BACKGROUND

Doherty amplifiers are amplifiers commonly used in wireless communication systems. Doherty amplifiers are used in base stations that enable the operation of wireless communications networks. Doherty amplifiers are suitable for use in such applications because the amplifiers include separate amplification paths, e.g., a carrier path and a peaking path. Amplifiers in the two paths are configured for operation at different classes. An amplifier in a carrier (or main) path is biased for operation in a class AB mode. An amplifier in a peaking amplification path operates in a class C mode.

The combination of the amplification paths and different modes of operation leads to improved power-added efficiency and linearity relative to, for instance, a balanced amplifier, at the power levels commonly encountered in wireless communications applications. When the carrier amplifier is operating below compression, the peaking amplifier is not operating. The linearity and efficiency of the carrier amplifier are thus not adversely affected by the peaking amplifier. Once the input power levels place the carrier amplifier into compression, the peaking amplifier begins to operate to thereby supplement the output of the carrier amplifier to maintain linearity. The Doherty amplifier thus provides efficient and linear operation over a wide range of input power levels.

A power splitter supplies the input signals to each amplification path in a Doherty amplifier. The power splitter divides the input signal into two or more signals in accordance with the architecture of the Doherty amplifier. The power splitter also adjusts the phase of the input signal for one or more of the amplification paths in accordance with the architecture, or type, of Doherty amplifier.

Doherty amplifiers are available in a number of different architectures. Examples include various types of two-way, three-way, or N-way Doherty amplifiers in accordance with the number of peaking amplification paths. Each Doherty amplifier may be configured as a conventional or inverted Doherty amplifier. Other differences in Doherty architectures involve symmetries or asymmetries in the size of the carrier and peaking amplifiers.

Different Doherty architectures are more or less well suited for various applications. For instance, architectures configured for high gain may be more desirable for certain base stations. The wide variety of applications leads to a large variance in Doherty amplifier architectures and configurations.

BRIEF DESCRIPTION OF THE DRAWINGS

The components and the figures are not necessarily to scale, emphasis instead being placed upon illustrating the principles of the various embodiments. Moreover, in the figures, like reference numerals designate corresponding parts throughout the different views.

DETAILED DESCRIPTION OF THE PRESENTLY PREFERRED EMBODIMENTS

Figure 1:
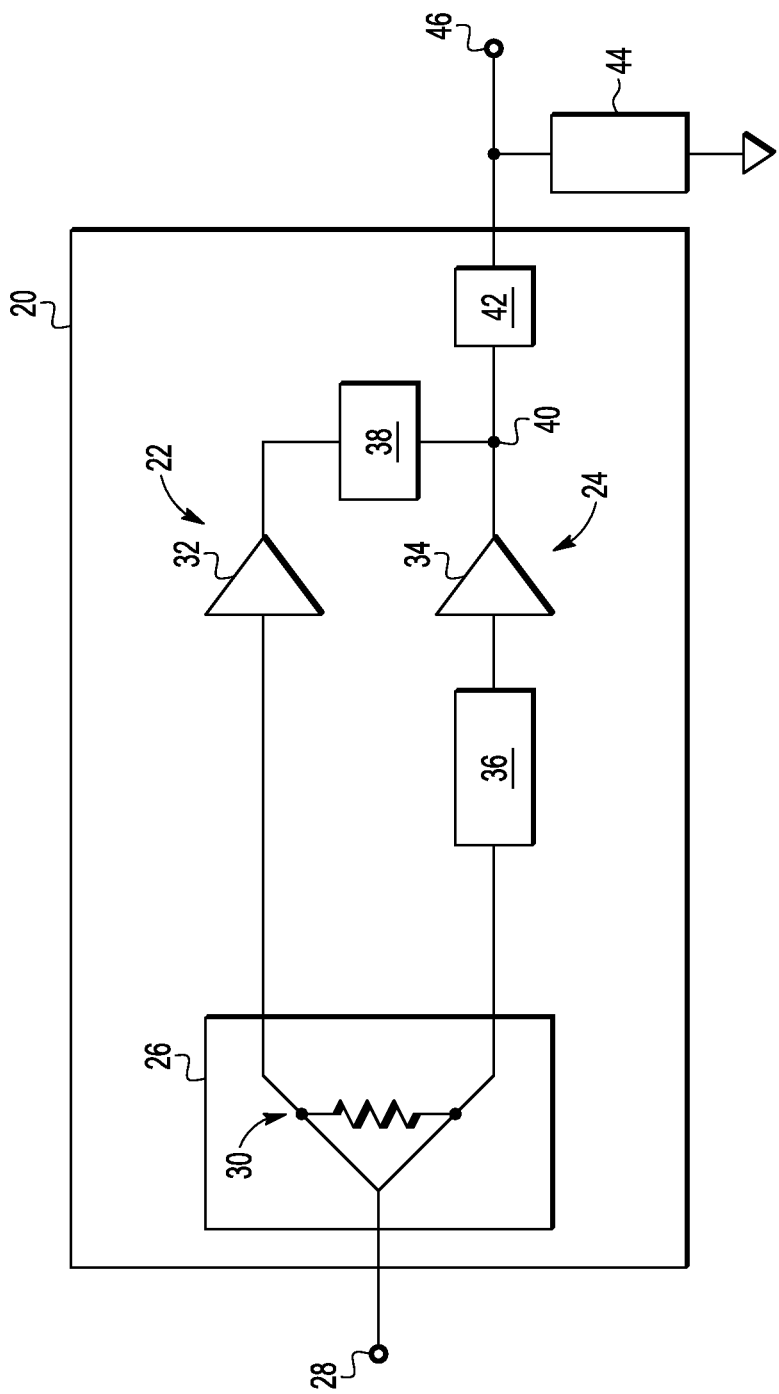
FIG. 1 is a schematic circuit diagram of a prior art Doherty amplifier device.

Embodiments of Doherty and other amplifier devices with a reconfigurable input phase adjustment circuit are described, along with methods of fabricating such devices. The reconfigurable input phase adjustment circuit allows a wide variety of amplifier architectures to be realized. Custom circuitry is thereby avoided. The wide variety of architectures helps to ensure that the most efficient or otherwise appropriate architecture is used in a given application.

While embodiments are described in connection with certain Doherty architectures, the reconfigurable input phase adjustments are well suited for use with other amplifier devices and architectures. For instance, the reconfigurable input phase adjustments may be implemented in connection with various alternative dual-path or multiple-path amplifier architectures.

The instant disclosure is provided to explain in an enabling fashion the best modes, at the time of the application, of making and using various embodiments in accordance with the present invention. The disclosure is further offered to enhance an understanding and appreciation for the inventive principles and advantages thereof, rather than to limit in any manner the scope of the invention.

It is further understood that the use of relational terms, if any, such as first and second, top and bottom, and the like are used solely to distinguish one entity or action from another without necessarily requiring or implying any actual such relationship or order between such entities or actions.

Much of the inventive functionality and many of the inventive principles are best implemented with or in integrated circuits (ICs) including possibly application specific ICs or ICs with integrated processing or control or other structures. It is expected that one of ordinary skill, notwithstanding possibly significant effort and many design choices motivated by, for example, available time, current technology, and economic considerations, when guided by the concepts and principles disclosed herein will be readily capable of generating such ICs and structures with minimal experimentation. Therefore, in the interest of brevity and minimization of any risk of obscuring the principles and concepts according to below-described embodiments of the present invention, further discussion of such structures and ICs, if any, will be limited to the essentials with respect to the principles and concepts of the various embodiments.

Doherty amplifiers are used in a number of wireless applications, as the amplifiers enable high efficiency over a wide output power range and can achieve a desired linearity using various linearization schemes. In many implementations, Doherty amplifiers include two amplifiers—a carrier or main amplifier, and a peaking amplifier. In a symmetric Doherty amplifier, the carrier and peaking amplifiers are the same size. Symmetric Doherty amplifiers are commonly used today, but asymmetric Doherty amplifiers that employ a peaking amplifier that is larger than the carrier amplifier offer the potential for additional efficiency improvements.

In a Doherty amplifier, an input signal is split at an input or power splitter between the main (or carrier) and peaking amplification paths or circuits. The split signals are then separately amplified by the main (or carrier) and peaking amplifiers of the Doherty amplifier and combined at an output stage. With the outputs of the main and peaking amplifiers combined, it may be desired to make adjustments in the phase and amplitude or attenuation of the Doherty device's input splitter. For instance, the adjustments may provide optimal balancing between the outputs of each path of the amplifier. To facilitate this adjustment, a Doherty amplifier may include an adjustable power divider or splitter that can be used to fine-tune the configuration of the input signals to both the main and peaking amplifiers. A Doherty amplifier may also include a phase adjustment circuit configured to selectively modify the phase shift of one of one or more paths of the Doherty amplifier so that the main and peaking amplifiers do not load one another during operation. Different phase shifts are used to realize respective Doherty amplifier architectures. The phase adjustment circuit is reconfigurable via multiple inputs (e.g., input leads) for one or more paths or outputs of the circuit. Selection of one of the input leads via, e.g., a wire bond connection, reconfigures the phase adjustment circuit for a desired architecture.

FIG. 1 shows a conventional Doherty amplifier device 20 including multiple amplification paths. In this case, the device 20 includes a main or carrier path 22 and a peaking path 24. A power splitter 26 is coupled to an RF input port 28 at which an RF input signal is received. The power splitter 26 is configured to divide the input signal into multiple signals and provide the signals to the carrier and peaking paths 22, 24. In this case, the power splitter 26 generates two output signals. In one implementation, the power splitter 26 can include a power divider 30 with an input for receiving the input signal, and first and second divider outputs. When connected to a symmetrical Doherty amplifier, the power divider 30 may divide the RF input signal into two similar signals of, e.g., equal power. In other cases, the power divider 30 may output signals having unequal power.

The outputs of the power splitter 26 are coupled to amplifier circuits 32, 34 of the carrier and peaking paths 22, 24, respectively. The carrier and peaking amplifier circuits 32, 34 may include one or more amplifier stages. For example, each amplifier circuit 32, 34 may include a low power stage and a high power stage. Each stage may include one or more transistors and associated circuitry, such as bias circuitry. These components of the carrier and peaking amplifier circuits 32, 34 may nonetheless be collectively referenced herein as carrier and peaking amplifiers 32, 34.

The amplifier device 20 may include one or more matching circuits. The matching circuits may be integrated with the power splitter 26 and/or the amplification paths 22, 24. The matching circuits may instead be configured as separate and discrete components. In this case, for example, the input of the carrier amplifier 32 is coupled via a matching network or circuit (not shown) to a first output of the power splitter 26. The input of the peaking amplifier 34 is coupled via a matching network or circuit (not shown) to a second output of power splitter 26.

One or both amplification paths 22, 24 may include a number of components to adjust the outputs of the power splitter 26 prior to amplification. For instance, the amplification paths 22, 24 may include one or more attenuators and/or one or more phase shifters. These circuits and other components are provided in addition to any matching or amplifier circuitry. The phase shifter(s) establish an input phasing arrangement that helps to avoid the carrier and peaking amplifiers 32, 34 loading one another.

The input phasing and amplification path arrangement is selected to configure the device 20 in accordance with one of the various Doherty architectures. In this example, the peaking path 24 includes a λ/4 transmission line phase shift element 36 that couples an output of the phase shifter 26 to the peaking amplifier 34. The phase shift element 36 is configured such that the amplification path 24 introduces a 90 degree delay of the RF input signal before amplification by the peaking amplifier 34. In practical implementations, the actual phase shift introduced by the phase shift element 36 may not equal 90 degrees, as the phase shift element 36 may introduce a higher or lower delay to take into account parasitic capacitances or inductances present in the amplification path 24. In this case, no relative phase shift is introduced on the carrier path 22. In some implementations, parasitic elements present along the carrier path 22 may make a zero phase shift impracticable. In such cases, an effective 180 or 360 degree phase shift may be introduced along the carrier path 22 to ensure that the signals on the amplification paths 22, 24 remain 90 degrees offset from one another. The relative 90 degree delay on the peaking path 24 establishes that the amplifier circuit 20 is configured as a two-way Doherty amplifier in a non-inverted (rather than inverted) Doherty amplifier architecture. An inverted two-way Doherty amplifier may be realized via placement of the relative 90 degree phase delay on the input side of the carrier path 22, rather than on the input side of the peaking path 24.

The device 20 includes an output phasing arrangement in accordance with the input phasing of the Doherty architecture. In a conventional Doherty architecture, an electrical delay is provided on the carrier output. The delay may be expressed as (2n−1)*90 degrees, where n is an integer greater than or equal to one. An inverted Doherty architecture is realized by restricting the electrical delay on the carrier output to 90 degrees. In this conventional two-way Doherty example, an impedance inverter or a λ/4 transmission line phase shift element 38 is connected between the output of carrier amplifier 32 and a summing node 40. The output of the peaking amplifier 34 is also coupled to the summing node 40. The phase shift introduced by element 38, in some implementations, compensates for the 90 degree relative phase shift present on the amplification path 24 introduced by phase shift element 36.

The device 20 also includes an impedance matching circuit 42 for an output load 44. The impedance matching circuit 42 may include one or more impedance elements to present the proper load impedances to the carrier and peaking amplifier 32, 34. The impedance matching circuit 42 may also be configured to combine the signals produced from each amplifier 32, 34 at a common output node 46. The output of the device 20 is thus efficiently provided to the impedance of the output load 44 (e.g., 50 ohms) via the output node 46.

The device 20 is configured so that only the carrier amplifier 32 provides the amplification for lower level input signals. Both the carrier amplifier 32 and the peaking amplifier 34 operate in combination to provide the amplification for high input level signals. These different operational characteristics may be accomplished by biasing the amplifiers 32, 34 differently. The carrier amplifier 32 is biased to operate in a class AB mode. The peaking amplifier 34 is biased to operate in a class C mode. The architecture of the device 20 is widely used in communication systems due to the architecture's capability to deliver high efficiency over an extended input signal range. The architecture can also linearize well using Digital Pre-Distortion (DPD) techniques.

Communication and other systems present a wide range of application scenarios. Different Doherty architectures are available to address the various application scenarios. The scenarios may, for instance, involve a wider input signal range than the range efficiently supported by one Doherty amplifier architecture. Some architectures may be more or less appropriate for other reasons, such as overall gain and bandwidth. Still other architectures may be configured to provide asymmetric amplification or multiple peaking paths for different amplification characteristics.

Described below are amplifier devices having reconfigurable input phasing to allow more than one amplifier architecture to be realized with a given set of amplifiers or amplifier IC chips. The reconfigurable input phasing is provided via an input phase adjustment circuit that includes multiple phase adjustment paths for at least one of the amplifiers. For instance, an embodiment of an input phase adjustment circuit may include an IC chip with two or more pins or input leads for a carrier amplifier. Selecting one of the pins realizes a conventional Doherty architecture, while selecting another one of the pins realizes an inverted Doherty architecture.

The flexibility provided by the reconfigurable input phasing allows the input phasing and amplifier circuitry to be disposed in a common package. The input phasing circuitry may thus move from a separate mounting on a printed circuit board (PCB) to a position inside a discrete IC package. The PCB arrangement is thus simplified, and a single IC chip may be relied upon to satisfy a variety of different application scenarios.

Figure 2:
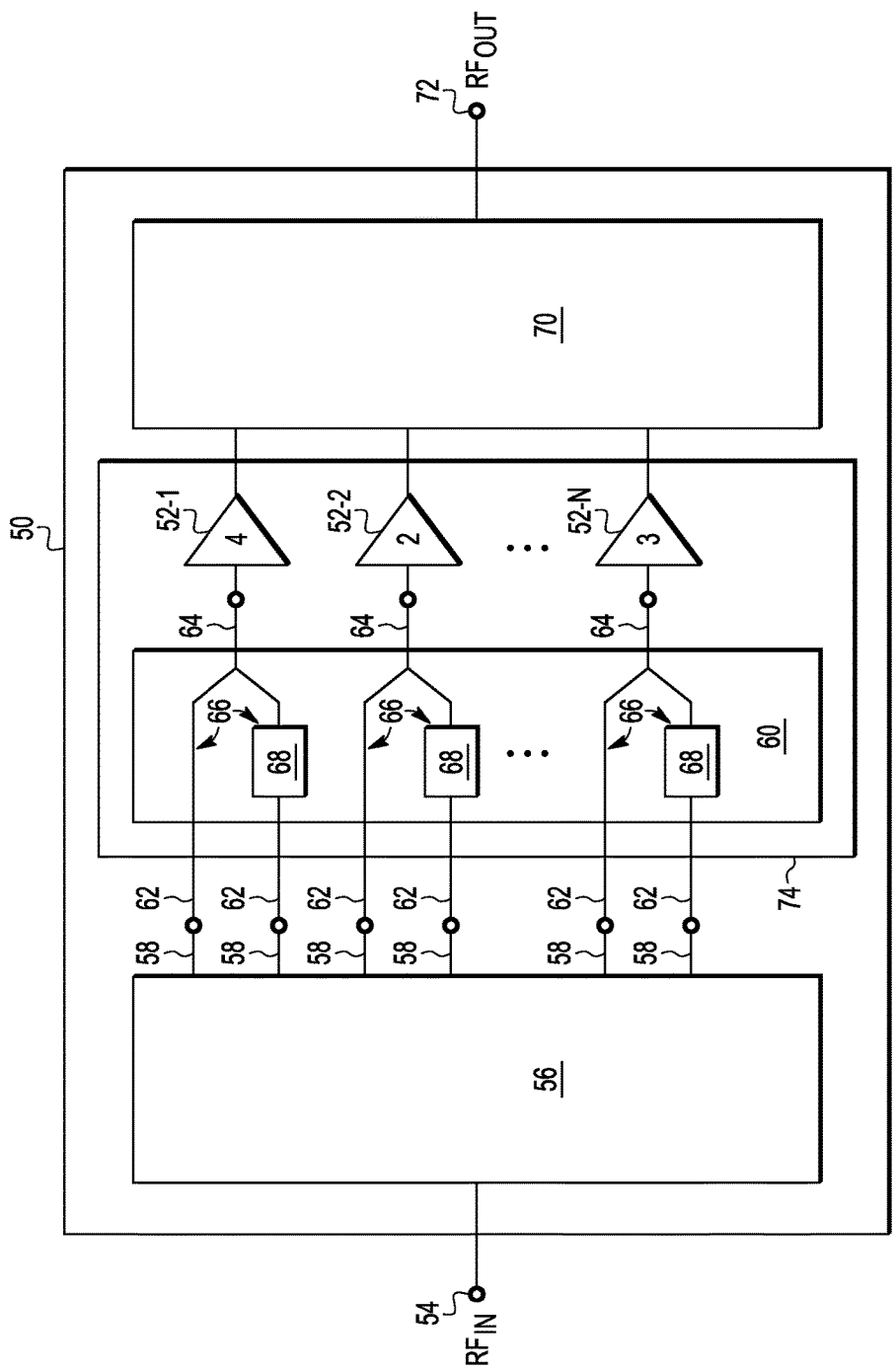
FIG. 2 is a schematic circuit diagram of an N-way Doherty amplifier device having a reconfigurable phase adjustment circuit in accordance with one example.

FIG. 2 depicts an amplifier device 50 with reconfigurable input phasing in accordance with one example. In this case, the device 50 is configured as an N-way Doherty amplifier device. The N-way Doherty architecture includes a number of amplifiers 52-1, 52-2, . . . 52-N, each of which disposed in, and configured for operation as, either a carrier amplification path or a peaking amplification path. In one example, the amplifiers 52-1 and 52-2 are disposed in carrier amplification paths, and all of the other amplifiers 52-N are disposed in peaking amplification paths. In some cases, the amplifiers 52-1, 52-2, . . . 52-N have a common configuration (e.g., identical amplifier circuitry). In such cases, a specific biasing arrangement is used to configure one of the amplifiers for operation as either a carrier or peaking amplifier. Alternatively, the amplifiers 52-1, 52-2, . . . 52-N are configured differently. For example, some of the amplifiers 52-1 may be larger or otherwise have more gain than some other amplifiers 52-2. As described below, different architectures (e.g., two-way non-inverted, two-way inverted, three-way, etc.) may be realized by selecting a subset of the amplifiers 52-1, 52-2, . . . 52-N to which an RF input signal is applied.

The device 50 includes an input port 54 at which an RF input signal is received. Each amplifier 52-1, 52-2, . . . 52-N is coupled to the input port 54. In this case, the coupling is provided by an input splitter 56 that splits or divides the input signal across a number of nodes 58, and a phase adjustment circuit 60 selectively connected to the output nodes 58. The selective connections are used to provide input phasing adjustments and thereby reconfigure the device 50.

Each node 58 of the splitter 56 is optionally electrically connected to a respective input 62 of the input phase adjustment circuit 60. Each input 62 may be or include a pin, lead, or other type of port. In the example of FIG. 1, the phase adjustment circuit 60 includes a pair of inputs 62 for each amplifier 52-1, 52- 2, . . . 52-N. To configure the device 50 for operation, one input 62 of each pair of inputs 62 is disconnected from the splitter 56. In some cases, the disconnected input 62 is then connected to ground. In other cases, the disconnected input 62 remains open or floating. Examples of the optional connections and disconnections are described below in connection with, for instance, FIGS. 3-5.

Each pair of inputs 62 is coupled to a respective output 64 of the phase adjustment circuit 60. Additional or fewer inputs 62 may be provided for a respective one of the outputs 64. For instance, one or more of the outputs 64 may be coupled to only a single one of the input ports 62. Alternatively or additionally, one or more of the output ports 64 may be coupled to more than two of the input ports 62.

Each amplifier 52-1, 52-2, . . . 52-N is coupled to a respective one of the output ports 64 of the phase adjustment circuit 60. In this example, the coupling is a direct electrical connection between the respective output port 64 and the respective one of the amplifiers 52-1, 52-2, . . . 52-N. The direct electrical connection may be or include, for instance, a wire bond between an output pin or lead of the phase adjustment circuit 60 and an input pin or lead of an amplifier IC chip. In other cases, there may be one or more intervening elements, such as an impedance matching circuit, attenuation circuit, or other element.

The phase adjustment circuit 60 provides reconfigurable input phasing for one or more of the amplifiers 52-1, 52-2, . . . 52-N. To that end, the phase adjustment circuit 60 includes a phase adjustment path 66 from each one of the inputs 62 to one of the outputs 64. Each output 64 may be coupled to one or more phase adjustment paths 66. In the example of FIG. 2, each respective output 64 is coupled to a pair of the phase adjustment paths 66 coupling a respective pair of the inputs 62 to the respective one of the outputs 64. The phase adjustment paths 66 of each such pair of phase adjustment paths 66 are configured to adjust a phase of the incoming RF signal differently from each other. In this example, for each pair, one phase adjustment path 66 has an effective phase change of about 0 degrees (or some relatively small or negligible amount), while the other phase adjustment path 66 has a quarter-wave delay element 68 to effectuate about a 90 degree phase adjustment of the incoming RF signal. In an embodiment, regardless of the specific phase change applied by each phase adjustment path 66 in a pair of paths connected to a same output 64, the difference between the phase adjustments applied by the paths 66 is about 90 degrees. For example, in an alternate arrangement, one phase adjustment path in a pair may have an effective phase change of about 35 degrees, while the other phase adjustment path has an effective phase change of about 125 degrees. Although the description herein may refer to one path in a pair applying 0 degrees of phase adjustment, and the other path applying 90 degrees of phase adjustment (or including a quarter-wave delay element), the example is not meant to be limiting. In some cases, one or more of the outputs 64 has additional or fewer phase adjustment paths 66. For example, one of the outputs 64 may have only a single phase adjustment path connected thereto.

The quarter-wave delay element 68 may include one or more discrete or distributed components. For example, the delay element 68 may include one or more capacitors, inductors, or other components that may be modeled as lumped elements, as well as one or more components that introduce capacitance or inductance in distributed fashion via, for instance, transmission lines. The components may be configured such that the combination of the elements and transmission lines effectuates the 90 degree phase adjustment. In some cases, the combined delay provided by the components of the delay element 68 alone may be offset from (e.g., greater or less than) 90 degrees to take into account the parasitic and other aspects or effects of other components or aspects of the coupling of the RF input signal to the amplifier. For example, the coupling may include or introduce an inductive component, which is addressed by the offset of the delay element 68 so that the 90 degree delay between the RF input port and the amplifier is achieved collectively.

The phase adjustment paths 66 shown in FIG. 2 without a delay element may also include one or more discrete or distributed components. In some cases, it may be impractical to realize a coupling with exactly zero added phase delay due to parasitic and other aspects and effects of the coupling. The zero-delay phase adjustment path 66 may accordingly be configured to effectuate a 180 or 360 degree delay instead. The phase adjustment path 66 may thus achieve an effectively zero degree delay. Such phase adjustment paths 66 are accordingly depicted without any delay-inducing components or other elements for ease in illustration only. The lack of any delay-inducing components or elements may thus be considered to also represent an equivalent arrangement of components or elements that achieve an effectively similar phase delay.

In the example of FIG. 2, the splitter 56 is configured to accommodate the excess number of phase adjustment paths. The number of output ports 58 of the splitter 56 exceeds the number of amplifiers 52-1, 52-2, . . . 52-N. In one example, there are two times as many output nodes 58. The input splitter 56 may thus be configured as an N-port network with 2N output nodes 58. The extent to which the number of output nodes 58 exceeds the number of amplifiers 52 may vary. For instance, there may be only a single, excess output node 58 in cases in which only one of the amplifiers 52-1, 52-2 . . . 52-N has more than one phase adjustment path 66. Alternatively, there may be greater than 2N output nodes, in which case one or more of the amplifiers 52-1, 52-2, . . . 52-N has more than a pair of phase adjustment paths 66. In still other examples, the number of output ports 58 equals the number of amplifiers 52. Various attenuation and/or other signal allocation schemes may be used for distributing the RF signal across the output ports 58.

The device 50 can be configured (or reconfigured) to realize a specific amplifier architecture due to the excess number of phase adjustment paths 66 and, in this case, output nodes 58 at the splitter 56. Configuration involves selecting the connections between the splitter 56 and the input phase adjustment circuit 60 at the nodes 58. In some cases, the device 50 is configured (or re-configured) by selectively disconnecting one or more of the electrical connections at the nodes 58. For instance, each electrical connection may be realized as a wire bond. A disconnection thus involves severing the wire bond or other electrical connection. A disconnection approach may be useful in cases in which the splitter 56 has an excess number of nodes 58. In other cases, the device 50 is configured by selectively establishing the electrical connections. For example, wire bonds may be selectively established between respective nodes 58 and input ports 62 of the phase adjustment circuit 60. The wire bonds may be formed between pins or other input leads of the corresponding input ports 62. In such cases, the splitter 56 may not have an excess number (e.g., a pair) of nodes 58 for each amplifier 52.

The device 50 includes a combiner network 70 coupled to the outputs of the amplifiers 52-1, 52-2, . . . 52-N. The combiner network 70 may include an arrangement of phase delay elements to realize a specific amplifier architecture (e.g., a Doherty architecture). The combiner network 70 combines the outputs of the amplifiers 52-1, 52-2, . . . 52-N to develop an RF output signal at an output port 72. The elements and components of the combiner network 70 vary with the architecture. Additional elements may also be included, including, for instance, impedance matching components or elements.

The device 50 may be realized via one or more IC chips and other discrete components in one or more packages or assemblies. In one example, the splitter 56, the phase adjustment circuit 60, the amplifiers 52-1, 52-2, . . . 52-N, and the combiner network 70 are disposed on respective IC chips. Alternatively, one or more of the splitter 56, the phase adjustment circuit 60, the amplifiers 52-1, 52-2, . . . 52-N, and the combiner network 70 are integrated to a desired extent on an IC chip. One or more of the splitter 56, the phase adjustment circuit 60, the amplifiers 52-1, 52-2, . . . 52-N, and the combiner network 70 may not be disposed on an IC chip, but instead, for example, include a number of components mounted on a PCB or a flange (e.g., a conductive flange that functions as a ground node for the device 50. The amplifiers 52-1, 52-2, . . . 52-N may be disposed on a single IC chip or a multiple IC chips dedicated to amplification. For example, each amplifier may be disposed on a respective IC chip.

Some or all of the ICs may be housed in a common package or other assembly. In the example of FIG. 2, respective dies of the input phase adjustment circuit 60 and the amplifiers 52-1, 52-2, . . . 52-N are disposed in a package 74, such as overmolded package. The dies may be disposed on one or more die pads of a lead frame for the package 74. The input ports 62 may thus include or correspond with pins or leads of the package 74. The various packages and components may then be mounted on a PCB board.

The input phase adjustment circuit 60 may or may not be configured such that the device 50 has equal numbers of amplifiers 52-1, 52-2, . . . 52-N and output ports 64. For example, the number of amplifiers 52-1, 52-2, . . . 52-N may be greater or less than the number of output ports 64. Excess amplifiers and/or excess output ports may provide flexibility to realize various amplifier architectures.

Figure 3:
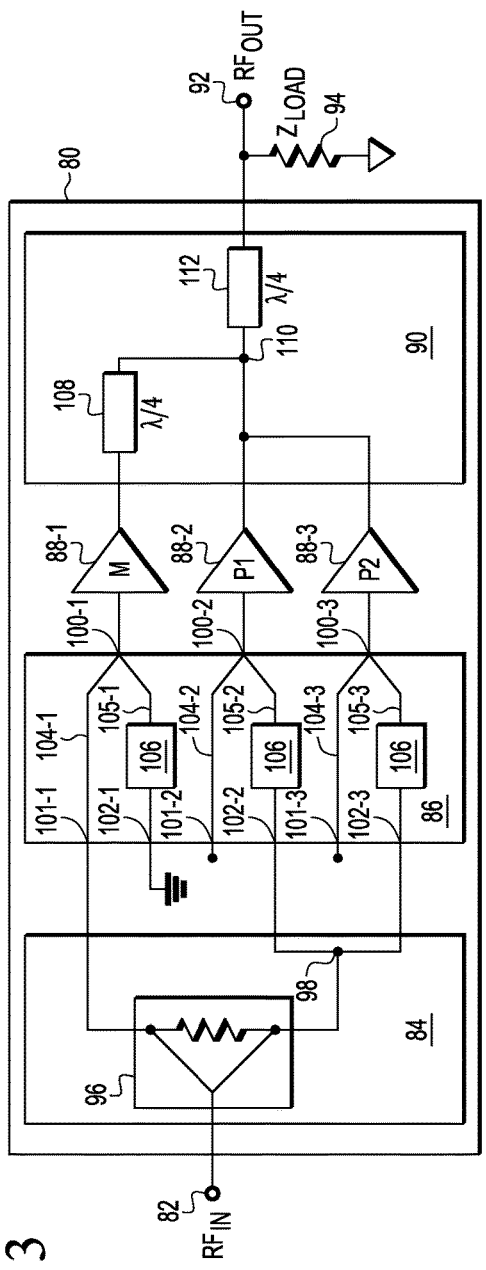
FIG. 3 is a schematic circuit diagram of a two-way Doherty amplifier device having a reconfigurable phase adjustment circuit for a non-inverted architecture in accordance with one example.

FIG. 3 depicts an amplifier device 80 having reconfigurable input phasing in accordance with an example directed to realizing Doherty amplifier devices having a two-way, non-inverted architecture (as opposed to an inverted architecture). The amplifier device 80 includes an RF input port 82 at which an RF input signal is received, a splitter 84 coupled to the input port 82, a phase adjustment circuit 86, a set of amplifiers 88-1, 88-2, 88-3, and a combiner 90 coupling the amplifiers 88 to an output port 92 through which power is delivered to a load 94.

In this case, the amplifier 88-1 is biased and/or otherwise configured to operate as the main or carrier amplifier, and the two other amplifiers 88-2, 88-3 are biased and/or otherwise configured to act as peaking amplifiers. The device 80 may be configured as a symmetric two-way Doherty amplifier if the amplifiers 88-1, 88-2, 88-3 are similarly sized and/or otherwise configured. Alternatively, the device 80 may be configured as an asymmetric two-way Doherty amplifier if the amplifiers 88-1, 88-2, 88-3 are not similarly sized and/or otherwise configured. In other cases, the device 80 includes fewer or additional amplifiers. For instance, two or more amplifiers may be used to realize the two-way Doherty architecture.

The splitter 84 is configured to divide the input signal across a number of nodes to support the input phasing for each one of the carrier and peaking amplifiers 88-1, 88-2, 88-3. In this case, the splitter 84 divides the input signal into three input signals for the phase adjustment circuit 86. A divider 96 of the splitter 84 first apportions the power between the carrier and peaking paths. The power for the peaking path is then divided again at a node 98 of the splitter 84. Other splitter arrangements may be used. For example, the splitter 84 may include more than one divider to further customize the apportionment of the input signal across the amplifiers 88-1, 88-2, 88-3.

The phase adjustment circuit 86 is configured to establish the input phasing for the carrier and peaking amplifiers 88-1, 88-2, 88-3 and thereby realize the two-way Doherty architecture. The phase adjustment circuit 86 accordingly has a set of outputs 100-1, 100-2, 100-3, each output 100 being coupled to a respective one of the amplifiers 88-1, 88-2, 88-3. The phase adjustment circuit 86 has a set of inputs 101, 102 for optional connections to the splitter 84. The inputs 101, 102 are arranged in pairs, each pair being associated with a respective one of the outputs 100 or amplifiers 88. The inputs 101, 102 are accordingly labeled in FIG. 3 with a numeral indicative of the output 100 or the amplifier 88 with which the input 101, 102 is associated. For instance, the output 100-1 is associated with the inputs 101-1 and 102-1. The output 100-2 is associated with the inputs 101-2 and 102-2. Lastly, the output 100-3 is associated with the inputs 101-3 and 102-3. The phase adjustment circuit 86 also includes a set of phase adjustment paths 104, 105. The phase adjustment paths 104, 105 are also arranged in pairs, each pair coupling a respective pair of the inputs 101, 102 to one of the outputs 100. The phase adjustment paths 104, 105 are accordingly labeled in FIG. 3 with a numeral indicative of the output 100 or the amplifier 88 with which the path 104, 105 is associated.

To set the input phasing for the device 80, one of the inputs 101, 102 is selected for each amplifier 88 during manufacture of the device 80 or during assembly of the device 80 into a larger system. "Selecting" an input includes establishing an electrical connection (e.g., using a wire bond or other conductor) between an output of the splitter 84 and the input 101 or 102. Selecting one of the inputs 101, 102, in turn, selects one of the phase adjustment paths 104, 105 for each output 100. The phase adjustment paths 104, 105 for each output 100 are configured to adjust a phase of the RF signal differently from each other. In this example, the phase adjustment paths 104, 105 may be configured as described above in connection with FIG. 2. Each phase adjustment path 104 may have about a zero (or effectively zero) phase delay. Each phase adjustment path 105 may have about a 90 degree phase delay provided by a phase delay element 106. Each phase delay element 106 may provide a delay greater or less than 90 degrees to account for any parasitic or other elements presented by the phase adjustment path 105. In addition, each phase adjustment path 104 may apply a delay greater than 0 degrees. Either way, the difference in the phase adjustment applied by each pair of paths 104, 105 is about 90 degrees, in an embodiment.

As shown in FIG. 3, to realize a Doherty amplifier device having a two-way, non-inverted architecture, the inputs 101, 102 of the phase adjustment circuit 86 are connected as follows. For the output 100-1 and the carrier amplifier 88-1, the input 101-1 is connected to one of the outputs of the splitter 84 to receive one of the RF signals produced by the splitter 84. The input 101-2 is connected (e.g., electrically tied) to ground so that the input 101-2 appears to the output 100-1 as an open circuit after the 90 degree phase delay imparted by element 106 in path 105-1. For the output 100-2 and the peaking amplifier 88-2, the input 101-2 is open or floating and the input 102-2 is connected to one of the outputs of the splitter 84 to receive another one of the RF signals produced by the splitter 84 after the effective 90 degree delay provided by the phase adjustment path 105-2. The input phasing for the output 100-3 and the peaking amplifier 88-3 is similar to the input phasing for the other peaking amplifier 88-2. The input 101-3 is open or floating and the input 102-3 is connected to yet another one of the outputs of the splitter 84 to receive another one of the RF signals produced by the splitter 84 after the effective 90 degree delay provided by the phase adjustment path 105-3.

The combiner 90 is configured in accordance with the two-way, non-inverted architecture. The combiner 90 includes a phase delay element 108 coupled to the output of the carrier amplifier 88-1. The phase delay element 108 is configured to compensate for the 90 degree delay introduced via the input phasing for the peaking amplifiers 88-2, 88-3. The phase delay element 108 may accordingly be configured to present a 90 degree delay or other delay to effectuate an effective 90 degree delay. The amplifier outputs are then combined at a summing node 110. In this example, a further phase delay element 112 (e.g., a quarter-wave element) is disposed between the summing node 110 and the output port 92 for impedance matching and/or other purposes.

Figure 4:
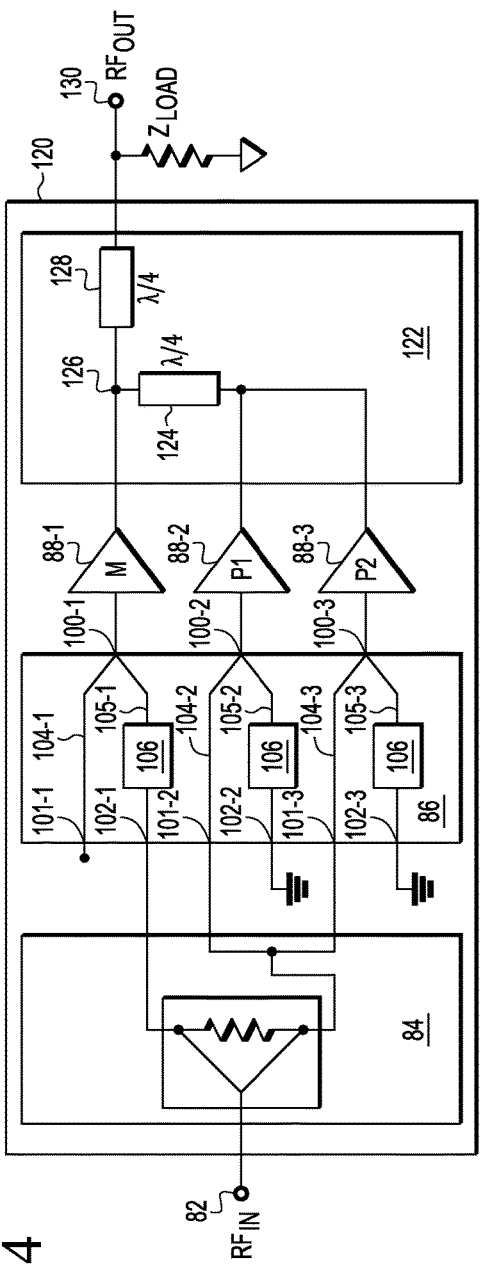
FIG. 4 is a schematic circuit diagram of a two-way Doherty amplifier device having a reconfigurable phase adjustment circuit for an inverted architecture in accordance with one example.

FIG. 4 depicts an amplifier device 120 having reconfigurable input phasing configured to implement a two-way, inverted architecture (as opposed to a conventional architecture). The amplifier device 120 may be configured similarly in many respects to the amplifier device 80 of FIG. 3. The amplifier device 120 may have several components in common with the amplifier device 80 of FIG. 3. For instance, the amplifier device 120 may use a similar or identical input splitter 84, phase adjustment circuit 86, and set of amplifiers 88. These components are thus indicated in FIG. 4 with like reference numerals.

To realize a two-way, inverted Doherty architecture, the inputs of the phase adjustment circuit 86 are connected as follows. For the output 100-1 and the carrier amplifier 88-1, the input 101-1 is left open or floating. The input 102-1 is now connected to one of the outputs of the splitter 84 so that the carrier amplifier 88-1 receives one of the output signals produced by the splitter 84 via the phase delay element 106 along the phase adjustment path 105-1. The phase delay element 106 effectuates about a 90 degree phase adjustment as described above. For the peaking amplifiers 88-2, 88-3, the inputs 101-2, 101-3 are connected to two other outputs of the splitter 84 so that two other output signals produced by the splitter 84 are provided via the zero (or zero effective) phase delay of the phase adjustment paths 104-2, 104-3. The other inputs 102-2, 102-3 are connected (or electrically tied) to ground to present an open circuit for the other phase adjustment paths 105-2, 105-3.

The amplifier devices 80 and 120 of FIGS. 3 and 4 thus depict the manner in which a single phase adjustment circuit 86 is capable of providing different input phasing. The amplifier device 80 may thus be reconfigured as the amplifier device 120 by switching the input connections to the phase adjustment circuit 86. Use of the same splitter 84, phase adjustment circuit 86, and amplifiers 88 simplifies installation, fabrication, and/or other aspects of implementation. For instance, the same package encompassing the phase adjustment circuit 86 and amplifiers 88 may be used for both non-inverted and inverted architectures, the only difference involving the different pins or leads selected for connections (e.g., wire bonds) to the splitter 84 and ground.

The amplifier device 120 may differ from the amplifier device 80 (FIG. 3) in other ways. For instance, a combiner 122 of the amplifier device 120 may have a different arrangement of phase delay and/or matching elements. In this case, the combiner 122 includes a quarter-wave element 124 disposed between the outputs of the peaking amplifiers 88-2, 88-3 and a summing node 126. One or more phase delay and/or impedance matching elements 128 may then be disposed between the summing node 126 and an output node 130. This different configuration of the combiner 122 may not constitute a hindrance, insofar as the configuration of the combiner 122 may be load-, application-, and/or site-specific regardless of the amplifier architecture.

Figure 5:
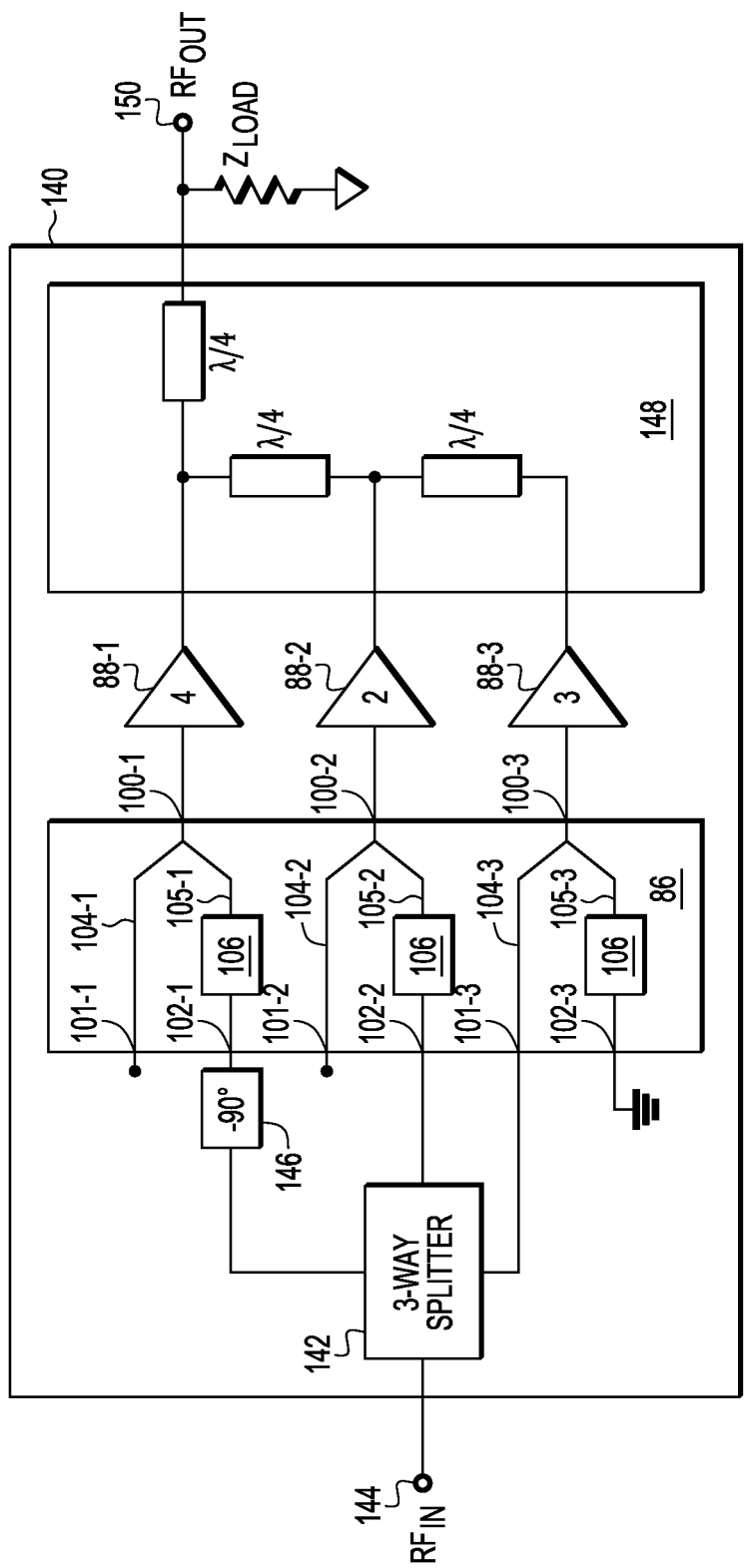
FIG. 5 is a schematic circuit diagram of a three-way Doherty amplifier device having a reconfigurable phase adjustment circuit for an inverted architecture in accordance with one example.

FIG. 5 depicts an amplifier device 140 having reconfigurable input phasing configured to implement a three-way, inverted Doherty architecture. The amplifier device 140 may be configured similarly in many respects to the amplifier devices 80, 120 of FIGS. 3 and 4, respectively. The amplifier device 140 may have several components in common with the amplifier devices 80, 120 (FIGS. 3 and 4). For instance, the amplifier device 140 may use a similar or identical phase adjustment circuit 86 and set of amplifiers 88. These components are thus indicated in FIG. 5 with like reference numerals. In some cases, the amplifiers 88 may be biased differently than the amplifiers 88 in the above-described examples. Alternatively or additionally, the device 140 includes amplifiers configured for a three-way, inverted Doherty architecture. For example, the peaking amplifiers 88-2, 88-3 may be biased and otherwise configured differently from one another.

The device 140 includes a three-way splitter 142 that divides an RF input signal received at an RF input port 144 into three portions for the phase adjustment circuit 86. The three-way splitter 142 may be configured to divide the power of the RF input signal equally or unequally across the three signal portions. For example, the signal portion provided for the main or carrier amplifier 88-1 may have a higher power level than either of the two signal portions provided for the peaking amplifiers 88-2, 88-3. The three-way splitter 142 may include or be coupled to impedance matching or other circuitry for preparing the RF input signal for amplification.

To realize a three-way, inverted Doherty architecture, the RF input port 144 is coupled to selected inputs of the phase adjustment circuit 86 as follows. As described above, the phase adjustment circuit 86 includes a respective pair of inputs 101, 102 for each pair of phase adjustment paths 104, 105 and each output 100 and amplifier 88. For the output 100-1 and the carrier amplifier 88-1, the input 101-1 is left open or floating. The input 102-1 is coupled to one of the outputs of the splitter 142 via a phase delay element 146. The phase delay element 146 may effectuate about a 90 degree phase delay. As described above in connection with other phase delay elements, the amount of phase delay may be greater or less than 90 degrees in cases in which the phase delay element 146 is configured to account for parasitic or other effects presented by the coupling. The additional 90 degree phase delay is combined with the approximately 90 degree phase delay introduced via the delay element 106 along the phase adjustment path 105-1. As a result, the carrier amplifier 88-1 receives the input signal with an effective 180 degree phase adjustment, with respect to the RF signal at input 144.

For the output 100-2 and the peaking amplifier 88-2, the input 101-2 is left open or floating. The input 102-2 is connected to one of the outputs of the splitter 142 so that the input signal is provided via the 90 degree phase delay of the phase adjustment path 105-2.

For the output 100-3 and the peaking amplifier 88-3, the input 101-3 is connected to one of the outputs of the splitter 142 to receive the input signal via the phase adjustment path 105-3 with zero (or zero effective) phase delay. The other input 102-3 is connected (or electrically tied) to ground to present an open circuit for the other phase adjustment path 105-3 after the 90 degree phase delay introduced via the phase delay element 106.

The device 140 includes a combiner 148 having a network of phase delay elements arranged in accordance with the three-way, inverted Doherty amplifier architecture. The combiner 148 sums the respective contributions from the amplifiers 88 and provides an output signal at an output port 150. Additional elements may also be included, including, for instance, impedance matching elements.

In the example of FIG. 5, the three-way, inverted architecture established via the phase adjustment circuit 86 is a minimum phase arrangement. One example of a minimum phase arrangement is an arrangement in which the electrical delay provided by the output matching network of the carrier and peaking amplifiers is not more than about 90 degrees. The minimum phase arrangement offers improved bandwidth performance for the carrier and peaking amplifiers. In other embodiments, phase arrangements other than minimum phase arrangements may be implemented.

Figure 6:
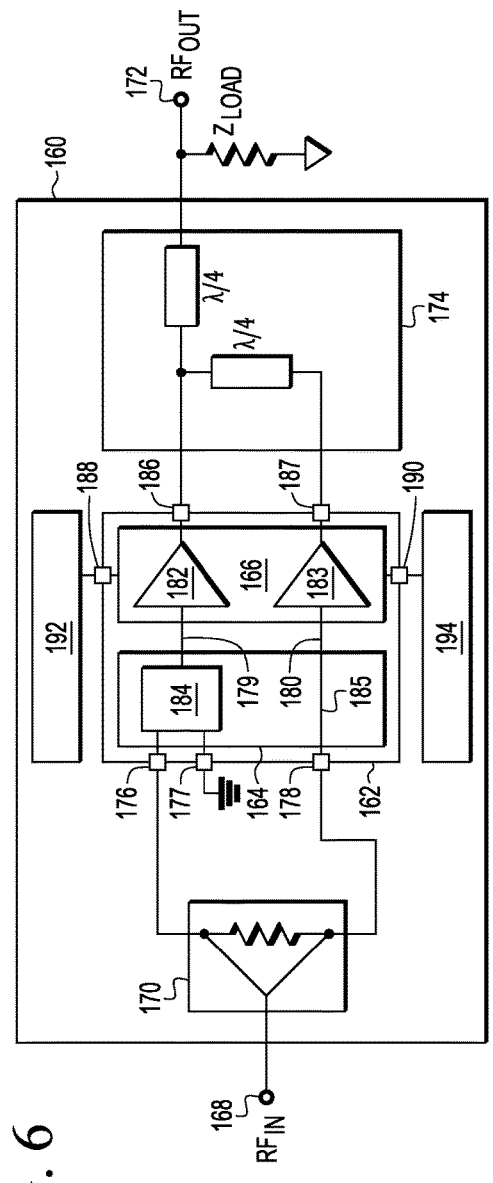
FIG. 6 is a schematic circuit diagram of a two-way, non-inverted Doherty amplifier device having a dual-path integrated circuit with reconfigurable input phasing in accordance with one example.

FIG. 6 depicts an amplifier device 160 with reconfigurable input phasing in accordance with one example. In this example, the amplifier device 160 includes an integrated circuit (IC) assembly 162 in which an input phase adjustment circuit 164 and a dual-path amplifier circuit 166 are disposed. For example, the IC assembly 162 may be encompassed in a single device package (e.g., a plastic encapsulated or air cavity package) in which ICs and/or other components are mounted on a common substrate (e.g., a conductive flange), and input pins or leads of the package provide for electrical connection of external components to the input phase adjustment circuit 164 and the amplifier circuit 166. For example, the input phase adjustment circuit 164 may be implemented using a compact PCB or integrated passive device component, and the amplifier circuit 166 may be implemented using high-power transistors within one or more semiconductor ICs. The IC assembly 162 is coupled to an RF input port 168 via a splitter 170 and to an RF output port 172 via a combiner 174. The splitter 170 and the combiner 174 may be configured as described above in connection with various examples of two-way Doherty examples. In this case, the splitter is selectively connected to the input phase adjustment circuit 164 to realize a two-way, non-inverted Doherty amplifier architecture. To that end, the splitter 170 is coupled to certain pins of the IC assembly 162 to select corresponding paths within the phase adjustment circuit 164 and thereby realize the desired architecture.

In the example of FIG. 6, the IC assembly 162 includes three input pins or leads 176-178 connected as follows. One output of the splitter 170 is connected (e.g., wire bonded) to the input pin or lead 176. The input pin or lead 177 is connected or electrically tied to ground. Another output of the splitter 170 is connected to the pin or lead 178.

The pins 176-178 may be considered to correspond with the inputs to the phase adjustment circuit 164. Each pin 176-178 is associated with a respective circuit or path of the phase adjustment circuit 164. Each respective circuit or path presents or introduces a respective (e.g., different) phase delay. The paths terminate at one of two outputs 179, 180 of the phase adjustment circuit 164. The outputs 179, 180 of the phase adjustment circuit 164 are connected (e.g., wire bonded) to a respective amplifier 182, 183 of the amplifier circuit 166.

The first and second input pins 176, 177 are connected to a phase delay circuit 184 of the phase adjustment circuit 164. In this example, the phase delay circuit 184 includes multiple paths, each leading from one of the input pins 176, 177 to the output 179. Each path introduces a different phase delay. Examples of the paths are described below in connection with FIG. 9.

The phase adjustment circuit 164 includes a further phase delay circuit 185 for the other output 180. In this example, the phase delay circuit 185 includes a single path leading from the input pin 178 to the output 180. The single path may introduce about zero phase delay or a phase delay that effectively amounts to zero phase delay, such as 360 degrees or 180 degrees. In an embodiment, regardless of the exact phase delays implemented between pins 176-178 and outputs 179, 180, the phase adjustment circuit 164 may be configured so that about a 90 degree phase difference may be produced between the signals at outputs 179, 180. The phase delay circuit 185 may also include one or more components or other elements to address parasitic and other effects presented along the path, as described above.

In this two-way, non-inverted case, the amplifier 182 is connected, biased, and otherwise configured for operation as the peaking amplifier. To that end, the path of the phase delay circuit 184 leading from the input pin 176 is configured to effectuate about a 90 degree phase delay. In some cases, the other path of the phase delay circuit 184 leading from the input pin 177 may effectuate a 180 degree phase delay. As explained further below in connection with FIG. 9, the input pin 177 may be connected or otherwise electrically tied to ground to avoid interfering with the 90 phase delay presented by the input pin 176.

The amplifier 183 is connected, biased, and otherwise configured for operation as the main or carrier amplifier. To that end, the other amplifier 183 is coupled (e.g., wire bonded) to the pin 178 via the phase delay circuit 185 to receive the input signal with about zero (or effectively zero) degrees of phase delay.

The amplifier circuit 166 may be configured such that each one of the amplifiers 182, 183 is capable of acting as either the main or peaking amplifier of a Doherty architecture. To that end, the amplifiers 182, 183 may deliver equal power. In some cases, the amplifier circuit 166 is configured as a dual-path IC chip, in which two amplifier outputs 186, 187 are provided—one for each amplification path. To establish one of the amplifier outputs 186, 187 as the carrier or peaking amplifier output, appropriate bias voltages are applied to the amplifier circuit 166. The amplifier circuit 166 includes a bias pin or lead 188 to receive the bias voltage for the amplifier 182, and a bias pin or lead 190 to receive the bias voltage for the amplifier 183.

The device 160 includes bias circuitry 192, 194 coupled to the pins 188, 190 to provide the bias voltages for the amplifiers 182, 183, respectively. In this case, the bias circuitry 192 is configured to provide a bias voltage suitable for a peaking amplifier. The bias circuitry 194 is configured to provide a bias voltage suitable for a carrier amplifier. In other cases, additional or fewer bias voltages are provided. For example, additional bias voltages may be provided for additional amplifier stages of one or both of the amplifiers 182, 183. Fewer bias voltages may be provided if, for instance, one bias voltage is derived from the other bias voltage. The circuitry used to derive the bias voltage may be resident, for instance, on the IC chip of the amplifier circuit 166. The components of the bias circuitry 192, 194 may be realized on one or more IC chips and/or disposed on a PCB on which one or more components of the device 160 are mounted.

The combiner 174 includes one or more phase delay and other elements and components configured and arranged to combine the outputs of the amplifiers 182, 183 in accordance with the two-way, non-inverted Doherty architecture. The phase delay and other elements and/or components of the combiner 174 may be disposed on an IC chip. The IC chip carrying the combiner 174 may be wire bonded or otherwise connected to the output pins 186, 187 of the IC assembly 162. The combiner 174 may not be realized on an IC chip. For instance, in other cases, the elements and components of the combiner 174 are disposed on a PCB on which one or more components of the device 160 are mounted.

Figure 7:
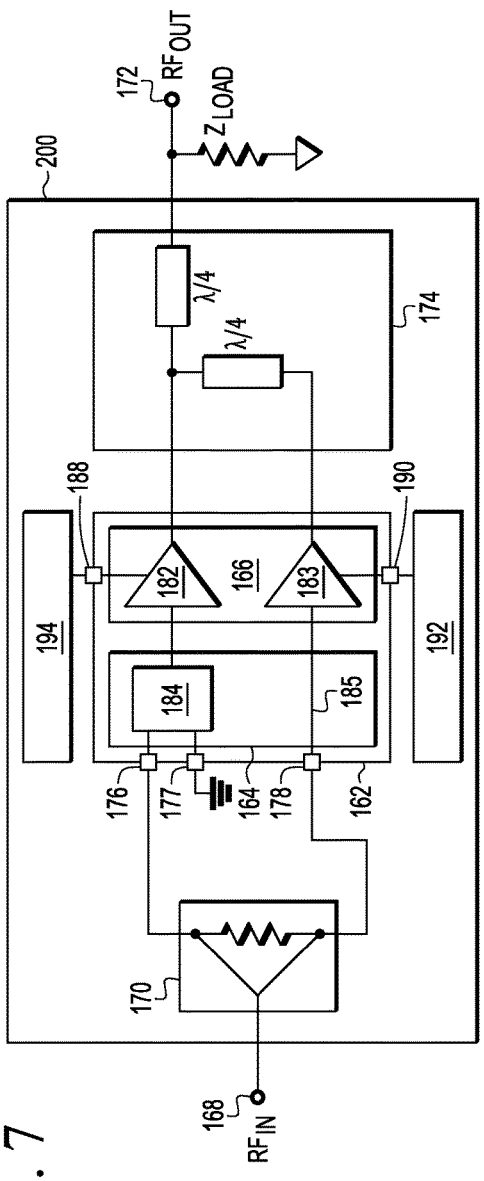
FIG. 7 is a schematic circuit diagram of a two-way, inverted Doherty amplifier device having a dual-path integrated circuit with reconfigurable input phasing in accordance with one example.

FIG. 7 depicts an amplifier device 200 with reconfigurable input phasing in accordance with one example. In this case, the input phasing of the amplifier device 200 is arranged or configured to realize a two-way, inverted Doherty architecture. The components of the amplifier device 200 may be identical or similar to those described above in connection with the amplifier device 160. Like reference numerals are therefore used to indicate like elements.

The only difference between this example and the example shown in FIG. 6 involves the biasing of the amplifiers 182, 183. The connections between the amplifiers 182, 183 and the bias circuitry 192, 194 are changed to switch the positions of the carrier and peaking amplifiers. In this case, the amplifier 182 is biased by the bias circuitry 194 to operate as a carrier amplifier, and the amplifier 183 is biased by the bias circuitry 192 to operate as a peaking amplifier. The change in connections may be realized by selecting different pins or leads for the bias circuitry 192, 194. In this case, the bias circuitry 194 is connected (e.g., wire bonded) to the pin 188, and the bias circuitry 192 is connected to the pin 190.

All of the other pin connections and circuit arrangements of the amplifier device 200 of FIG. 7 may remain the same as shown in FIG. 6. For example, the connections at the pins 176, 177, and 178 may all remain the same. In another example, the connection of the combiner 174 and the pins 186, 187 may also remain the same because the output of the amplifier 182, now acting as the carrier amplifier, is fed through a delay element in accordance with the inverted architecture of the device 200. The combiner 174 may be integrated to any desired extent. For instance, the combiner 174 may include a set of discrete components separately mounted on a circuit board and connected to form the delay and other elements of the combiner 174.

The amplifiers 182, 183 may be configured in a manner that accommodates the alternative connections. For example, additional pins, leads, or other components may be provided.

Figure 8:
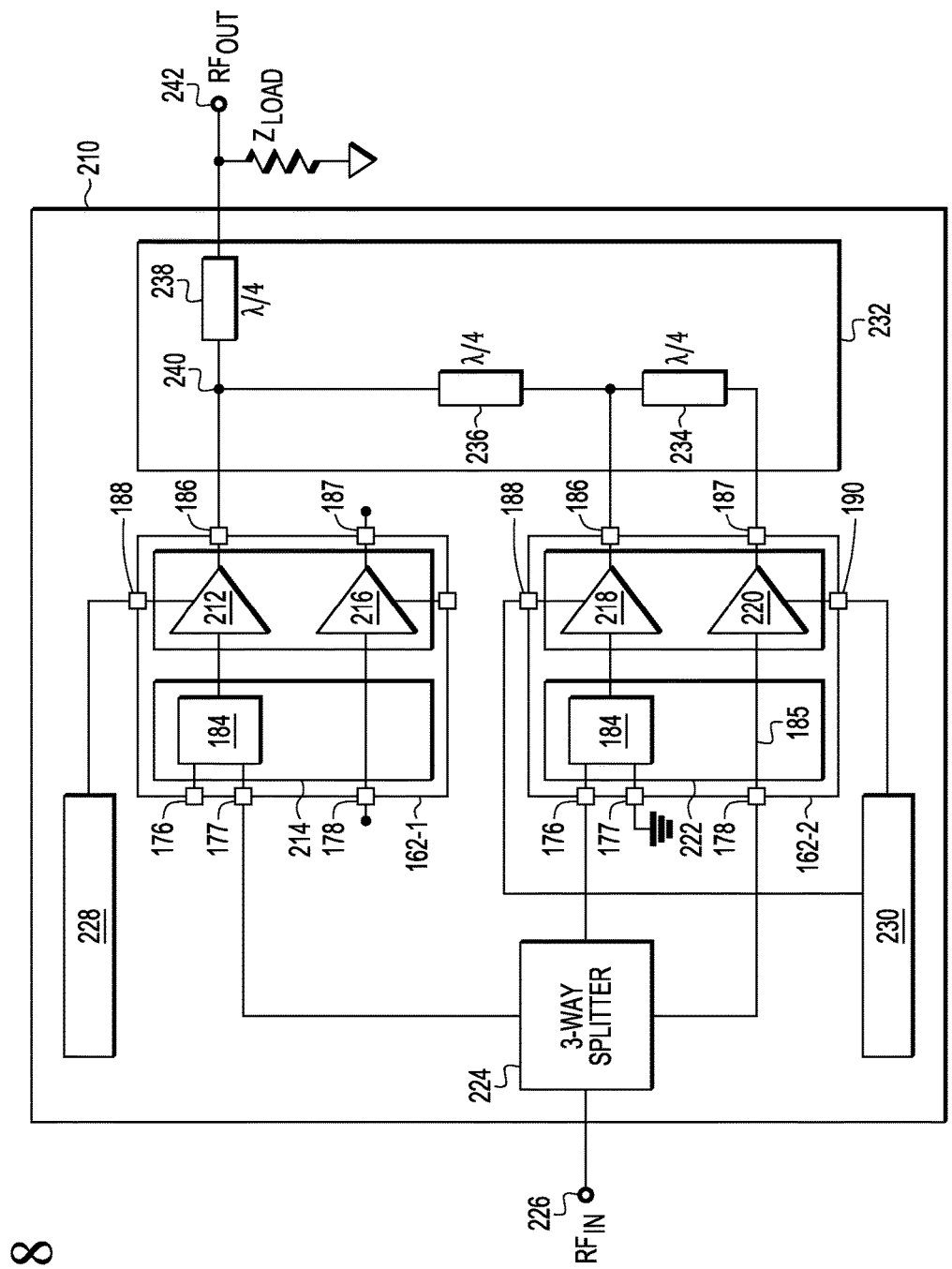
FIG. 8 is a schematic circuit diagram of a three-way, inverted Doherty amplifier device having dual-path integrated circuits with reconfigurable input phasing in accordance with one example.

FIG. 8 depicts an amplifier device 210 that uses reconfigurable input phasing to realize a three-way inverted Doherty amplifier architecture. In this example, the amplifier device 210 includes two versions or instances of the IC assemblies 162 described above in connection with FIGS. 6 and 7. One of the IC assemblies, labeled 162-1, includes an amplifier 212 configured to act as a carrier amplifier via an input phase adjustment circuit 214 of the IC assembly 162-1, and an unconnected amplifier 216 (i.e., unconnected from the input splitter 224 and the output combiner 232). The other one of the IC assemblies, labeled 162-2, includes amplifiers 218, 220 configured to act as peaking amplifiers. The amplifier 218 is connected to a phase adjustment circuit 222 of the IC assembly 162-2.

The phase adjustment circuits 214, 222 of the two IC assemblies 162-1, 162-2 are configured to establish a three-way, inverted Doherty architecture in the following manner. As with the phase adjustment circuits described above in connection with FIGS. 6 and 7, the phase adjustment circuit 214 includes a phase delay circuit 184 with multiple paths, one of which may establish about a 180 degree phase delay for the amplifier 212 (e.g., the path connected between pin 177 and amplifier 212). To that end, a three-way splitter 224 provides a portion of an RF input signal received at an RF input port 226 to the pin 177 of the IC assembly 162-1 via a wire bond or other connection. The other pins 176, 178 are left open, or unconnected. Turning to the next amplification path, the phase adjustment circuit 222 also includes a phase delay circuit 184 with multiple paths, one of which establishes about a 90 degree phase delay for the amplifier 218 (e.g., the path connected between pin 176 and amplifier 218). To that end, the splitter 224 is connected (e.g., wire bonded) to the pin 176 of the IC assembly 162-2. The pin 177 is electrically tied to ground. Turning to the last amplification path, an effective 0 degree phase delay is established for the amplifier 220 via a phase delay circuit 185 with a single path, as described above in connection with FIGS. 6 and 7. To that end, the splitter 224 is connected (e.g., wire bonded) to the pin 178 of the IC assembly 162-2. As described above, the single path of the phase delay circuit 185 between the pin 178 and the amplifier 220 may include one or more delay elements that collectively establish the effective 0 degree phase delay by virtue of, for instance, a 360 degree delay.

The amplifier device 210 may have one or more bias circuits to configure the various amplifiers for operation as either carrier or peaking amplifiers. In the example of FIG. 8, the amplifier device 210 includes a main bias circuit 228 and a peaking bias circuit 230. The main bias circuit 228 is connected to the pin 188 of the IC assembly 162-1 to bias the amplifier 212 to operate as a carrier amplifier. The peaking bias circuit 230 is connected to the pins 188, 190 of the IC assembly 162-2 to bias both of the amplifiers 218, 220 to operate as peaking amplifiers. The bias circuitry may differ in other cases. For example, different circuitry may be provided to bias the peaking amplifiers 218, 220 differently. In an embodiment, the biasing of amplifiers 218, 220 may be controlled so that the amplifiers 218, 220 turn on at different operating points.

The amplifier device 210 includes a combiner 232 to combine the respective outputs of the IC assemblies 162-1, 162-2. The combiner 232 is accordingly connected (e.g., wire bonded) to one of the output pins 186 of the IC assembly 162-1 and to both of the output pins 186, 187 of the IC assembly 162-2. In this three-way Doherty example, the combiner 232 includes a delay element 234 between the outputs of the peaking amplifiers 218, 220 and a delay element 236 between the outputs of peaking amplifier 218 and carrier amplifier 212. Each delay element 234, 236 may include one or more components to establish about a 90 degree delay. Another delay element 238 is disposed between a summing node 240 and an RF output port 242 of the amplifier device 210. The delay element 238 may present a further phase delay (e.g., about a 90 degree phase delay) and/or be configured for impedance matching.

The unconnected amplifier 216 of the IC assembly 162-1 is an extra amplifier not used in the three-way architecture of the amplifier device 210. The presence of an extra amplifier may be warranted given that the same IC assembly 162 may be used to realize various Doherty amplifier architectures, including, for instance, the architectures shown in the examples of FIGS. 6-8.

Figure 9:
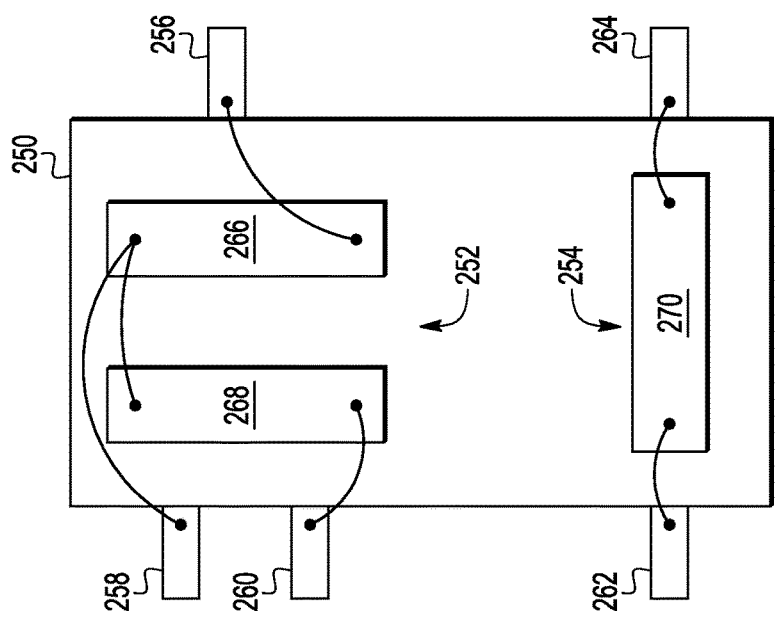
FIG. 9 is a schematic circuit diagram of a reconfigurable phase adjustment circuit in accordance with one example.

FIG. 9 depicts a phase adjustment circuit 250 for reconfigurable input phasing in accordance with one example. The phase adjustment circuit 250 may be used to realize different phase delays in one of the amplifier devices described above. In some cases, the phase adjustment circuit 250 is a discrete IC or PCB disposed in a packaged assembly of ICs. The extent to which the phase adjustment circuit 250 is integrated with an amplifier or other IC may vary. For instance, in some cases, the phase adjustment circuit 250 may be integrated with an amplifier die, while in other cases, the phase adjustment circuit 250 may be realized on a PCB on which one or more ICs are mounted.

The phase adjustment circuit 250 includes two circuits (or sub-circuits) 252, 254. In this example, the circuit 252 provides multiple paths to an output 256. Selecting one of two inputs 258, 260 selects one of the paths. The inputs 258, 260 may be configured as, or be otherwise tied to, or associated with, input pins or leads, such as the pins 176, 177 (FIG. 6). The circuit 254 provides a single path from an input 262 to an output 264. The input 262 may be configured as, or be otherwise tied to, or associated with, another input pin or lead, such as the pin 178 (FIG. 6). Similarly, the outputs 256, 264 may be configured as, or be otherwise tied to, or associated with, other output pins or leads, such as outputs 179, 180 (FIG. 6). The number of inputs, outputs, and paths may vary from the example shown. For instance, the circuit 254 may be configured as multiple path circuit, in which case multiple inputs may be provided and associated with the output 264.

The circuit 252 includes a pair of delay elements 266, 268. For example, each of delay elements 266, 268 may be implemented as a conductive microstrip line with a length configured to impart a desired delay to a signal conducted through the microstrip line. Alternatively, each of delay elements 266-268 may be implemented with lumped elements (e.g., inductors and/or capacitors) in combination with or instead of microstrip lines. The delay element 266 has one end connected to the input 258 and another end coupled to the output 256. The delay element 266 thus presents one path through the circuit 252. Another path through the circuit 252 includes both of the delay elements 266, 268. To that end, the delay element 268 has one end connected to the input 260 and another end coupled to the delay element 266 such that the delay element 268 is coupled to the output 256 via the delay element 266. In this example, each of the aforementioned connections is realized via a respective wire bond. Other types of connections may be used, including, for instance, circuit board connections.

The foregoing connections establish a pair of phase delay paths (e.g., phase adjustment paths) through the circuit 252. The connection of the input 258 to the delay element 266 includes or incorporates the delay element 266 in a first path of the pair and, in so doing, bypasses the delay element 268. The connection of the input 260 to the delay element 268 incorporates both of the delay elements 266, 268 in a second path of the pair.

In some cases, the delay element 266 is configured such that the first path has or presents about a 90 degree phase delay. The actual amount of phase delay introduced by the delay element 266 may vary in accordance with other factors, including the effects of any parasitic capacitances or inductances introduced along the path.

The delay elements 266, 268 may then be configured such that the second path has or presents about a 180 degree phase delay. The 180 degree phase delay includes the 90 degree phase delay from the delay element 266, and another 90 degree phase delay from the delay element 268. Again, the actual amount of phase delay introduced by the delay elements 266, 268 may vary in accordance with other factors, including the effects of any parasitic capacitances or inductances introduced along the path.

The connections to the inputs 258, 260, 262 are then selected to realize these phase delays. To present a 90 degree phase delay, the input 258 is connected to receive the incoming RF signal, and the input 260 is connected or otherwise tied to ground. The ground connection acts as if the input 260 is open or floating because of the 90 degree phase delay introduced by the delay element 268. To present a 180 degree phase delay, the input 260 is connected to receive the incoming RF signal, and the input 258 is left unconnected or open.

In the example of FIG. 9, only a single path passes through the circuit 254 from the input 262 to the output 264. The circuit 254 may include any number of components or other elements along the path. The circuit 254 is shown in simplified form with a single element 270 for ease in illustration. The element 270 may introduce about a zero degree (or effectively zero degree) phase delay. Additional inputs and paths may be provided in other cases. For example, the circuit 254 may be configured in a manner similar to that of the circuit 252 to provide a pair of reconfigurable phase delay paths.

Each of the above-described amplifiers may have any number of stages. The amplifiers of a device may have the same or a different number of stages. In one example, a carrier amplifier of a device may include multiple stages, while the peaking amplifier(s) of the device may have only a single stage. In other examples, the peaking amplifiers of an amplifier device have differing numbers of stages. The term "amplifier" is accordingly used herein in a manner that encompasses both single-stage and multiple-stage amplifiers. The amplifiers of the devices may differ in other ways, including, for instance, the size of the transistors in the amplifiers.

The phase adjustment circuits described above, e.g., with respect to FIG. 9, include two inputs (e.g., the inputs 258, 260) and a single output (e.g., the output 256). As described above, a path may be selected by selectively connecting an input RF signal to one of the inputs (e.g., either to the input 258 or the input 260). In alternative cases, the phase adjustment circuit includes a single input and multiple (e.g., two) outputs. In such cases, a path may be selected by selectively connecting one of the two outputs to an amplifier.

Figure 10:
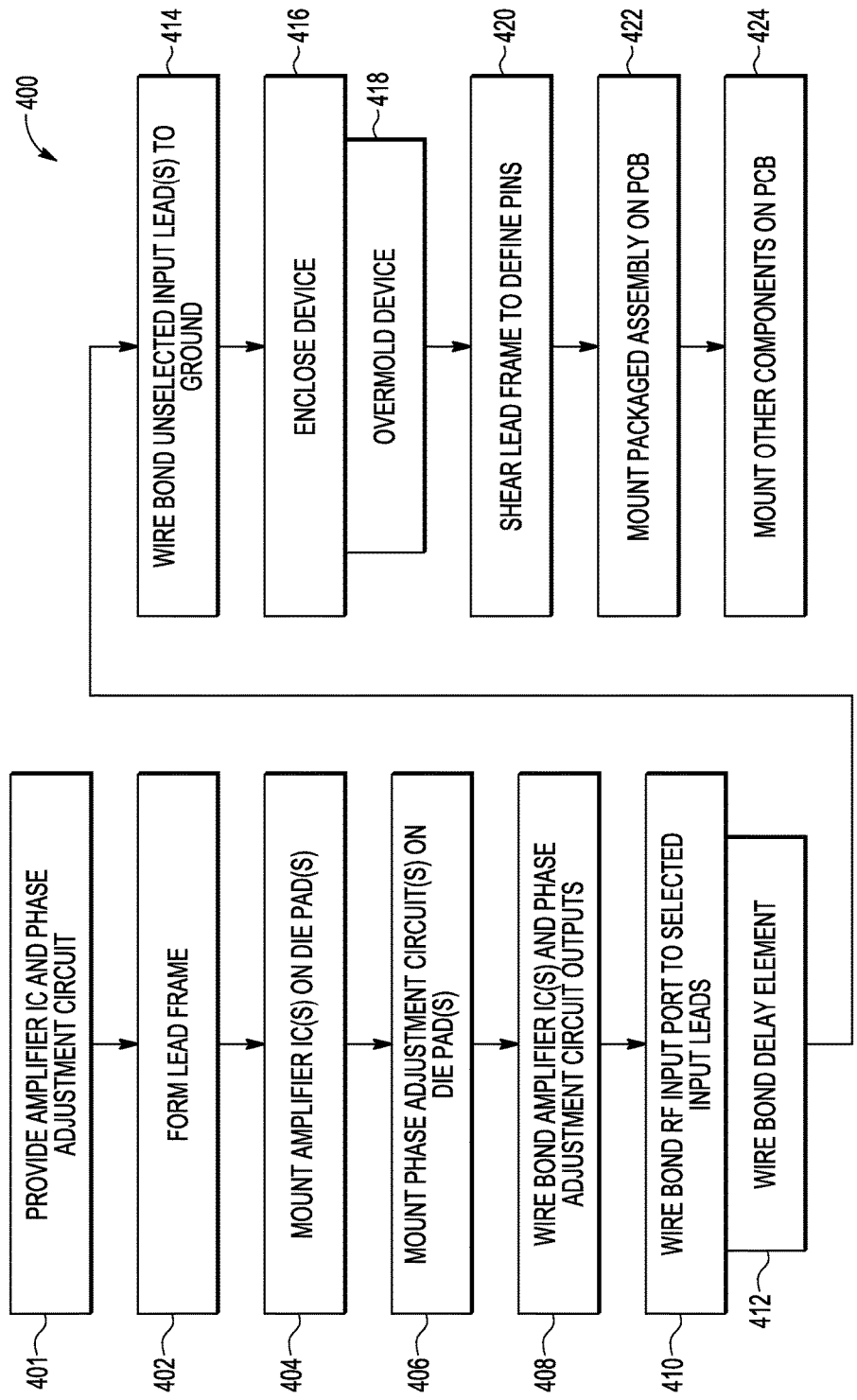
FIG. 10 is a flow diagram of a method of fabricating a Doherty amplifier device with a reconfigurable phase adjustment circuit in accordance with one example.

FIG. 10 shows an exemplary method 400 for fabricating one or more of the above-described amplifier devices. In this example, the method 400 is configured to fabricate one or more components of the amplifier devices in a package or assembly. The extent to which components or elements of the amplifier device are housed or packaged together as an assembly or otherwise integrated may vary. For instance, some of the components or elements may be mounted on a PCB rather than be disposed within a packaged assembly. The method includes a sequence of acts, only the salient of which are depicted for convenience in illustration.

The method 400 may begin with acts directed to forming or otherwise providing die and a lead frame for the die. For instance, one or more amplifier IC chips and one or more input phase adjustment circuits may be fabricated or otherwise provided in an act 401. Each amplifier IC chip is implemented as a semiconductor die. In some cases, each input phase adjustment circuit is also provided on a semiconductor die. Alternatively, each input phase adjustment circuit may be implemented on a PCB or other substrate. An act 402 is directed to forming a lead frame. For example, a lead frame may be formed via a stamping procedure. In other cases, the lead frame may be pre-fabricated or otherwise made available. Forming the lead frame defines one or more die pads and other structures to support the IC chips and other components of the amplifier devices.

Although described herein in connection with a lead frame, the method is not limited to a lead frame-based process. For example, the amplifier devices may be assembled or otherwise fabricated in a module environment. In still other cases, the elements of the amplifier devices may be assembled on a PCB without the lead frame-based packaging described herein.

Once the lead frame is formed or otherwise available, various IC chips or die and other components may be disposed on die pad(s) of the lead frame. In the example of FIG. 10, an amplifier IC chip is disposed on a die pad of the lead frame in an act 404, and an input phase adjustment circuit is disposed on another die pad of the lead frame in an act 406. Alternatively, the amplifier IC chip(s) and the phase adjustment circuit(s) may be disposed on a same die pad. The IC chips may be mounted on the die pads in various ways using, for instance, solder, sintering, adhesives, and/or other materials and techniques. The lead frame is configured such that a pair of inputs are presented for one or more of the input phase adjustment circuit(s). For example, each input of the pair of inputs may be a respective pin or lead of the lead frame. Each input phase adjustment circuit includes a pair of phase adjustment paths coupled to the pair of inputs, respectively. As described above, a desired one of the pair of phase adjustment paths is configured to receive an incoming RF signal by selecting one of the pair of inputs.

The number of amplifier IC chips and/or phase adjustment circuits mounted or otherwise disposed on die pads of the lead frame in the acts 404, 406 may vary from the example shown. For example, the method 400 may include disposing one or more amplifier IC chips on the lead frame to realize, for instance, a two-way or three-way Doherty amplifier architecture, such as the ones described above in connection with FIGS. 3-8. The order in which the IC chips are mounted or otherwise disposed on the lead frame may also vary from the example shown.

A number of wire bonding procedures are performed to establish connections between the IC chips and other nodes of the amplifier device. The order in which the wire bonding procedures are performed may vary from the example of FIG. 10. For instance, the wire bonds at the RF input may be formed before the wire bonds at the outputs of the phase adjustment circuit.

In an act 408, outputs of the phase adjustment circuit(s) are coupled via wire bonding to the amplifier IC chip(s). In some cases, the wire bonds are formed using a ball bonding procedure. Additional or alternative procedures may be used. For example, wedge bonding procedures may be used. The configuration and construction of the wire bonds may vary accordingly. One or more of the outputs of the phase adjustment circuit(s) may not be coupled to an amplifier IC chip. The three-way Doherty amplifier architecture described in connection with FIG. 8 presents one example of an uncoupled output.

In an act 410, an RF input port is coupled via wire bonding to one of the pair of inputs of each phase adjustment circuit. Selecting one of the pair of inputs selects one of the pair of phase adjustment paths to adjust a phase of the RF signal in accordance with the selected phase adjustment path. The act 410 may include an act 412 in which further wire bonds are formed to connect further circuit elements, such as a further delay element as shown in the example of FIG. 5.

Wire bonds may also be formed in connection with the unselected inputs of the phase adjustment circuit(s). In some cases, one or more of the inputs of the phase adjustment circuit(s) is/are connected or electrically tied to ground. To that end, the method 400 may include an act 414 in which one or more unselected inputs are connected to ground via wire bond(s). For example, the act 414 may be implemented in connection with an amplifier architecture in which the selected phase adjustment path to which the other input is coupled is configured to present a 90 degree phase shift. As described above, the output of that coupling and phase adjustment may be connected to a carrier amplifier on the amplifier IC chip to realize, for instance, the amplifier architecture shown in FIG. 3. A variety of other architectures may be realized through other coupling arrangements and phase shifts, as described above. For instance, one or more of the unselected inputs are alternatively or additionally left unconnected to present an open circuit to the phase adjustment circuit. That arrangement may be useful for realizing, for instance, the amplifier architecture of FIG. 5.

Once the wire bonds are formed, the ICs are enclosed or packaged in an act 416. The configuration, construction, and other characteristics of the packaging may vary. For example, an overmolding procedure may be performed in an act 418. Other enclosures alternatively may be used, such as air cavity enclosures.

The lead frame is then sheared in an act 420 to define pins or other leads of the packaged IC assembly. Using the pins, the assembly may then be mounted on a PCB of the amplifier device in an act 422. In some cases, the mounting of the assembly connects the amplifier IC chip(s) to bias circuitry. The bias circuitry may include one or more circuits, such as a bias circuit for each peaking amplifier and a bias circuit for the carrier amplifier. In some cases, the bias circuitry is mounted or otherwise disposed on a PCB. The mounting of discrete components of such circuitry may be implemented in an act 424. Alternatively or additionally, some or all of the bias circuitry is enclosed in the package in which the amplifier and other IC chips are disposed. The act 424 may include mounting other components, such as the elements or other components of a combiner, on the PCB.

Additional, fewer, or alternative acts may be implemented. For example, in cases in which multiple phase adjustment circuits are included, further wire bonds may be formed to realize other amplifier architectures, such as the architecture shown in FIG. 8. In that case, the act 408 may further include connecting, via wire bonding, the two outputs of a further input phase adjustment circuit to the two amplifiers on a further amplifier IC chip, respectively. For a first one of the two amplifiers, the RF input port may then be coupled via wire bonding to one of a further pair of inputs to select one of a further pair of phase adjustment paths to adjust a phase of the RF signal in accordance with the selected phase adjustment path.

The ordering of the acts may vary in other embodiments. For example, the mounting of any number of discrete components on the PCB in the act 424 may occur in parallel with or before the formation of the packaged IC assembly.

In a first aspect, a device includes first, second, and third inputs to receive an RF signal, first and second amplifiers, and an input phase adjustment circuit coupling the first, second, and third inputs to the first and second amplifiers, the input phase adjustment circuit having first and second outputs coupled to the first and second amplifiers, respectively. The input phase adjustment circuit includes a pair of inputs, where the pair of inputs includes the first and second inputs, for the first output and a pair of phase adjustment paths coupling the pair of inputs to the first output, respectively. The pair of phase adjustment paths are configured to adjust a phase of the RF signal differently for the first output.

In a second aspect, a Doherty amplifier includes an RF input port to provide an RF signal, a carrier amplifier coupled to the RF input port, a peaking amplifier coupled to the RF input port, and an input phase adjustment circuit coupling the RF input port to the carrier and peaking amplifiers. The input phase adjustment circuit has first and second outputs coupled to the carrier and peaking amplifiers, respectively. The input phase adjustment circuit includes, for each of the first and second outputs, a pair of inputs and a pair of phase adjustment paths coupled to the pair of inputs, respectively. For each of the carrier amplifier and the peaking amplifier, the RF input port is coupled to one of the pair of inputs pair to select one of the pair of phase adjustment paths and establish a respective phase adjustment of the RF signal.

In a third aspect, a method of fabricating an amplifier includes providing an amplifier integrated circuit (IC) chip on a die, providing an input phase adjustment circuit that includes a pair of inputs and a pair of phase adjustment paths coupled to the pair of inputs, respectively, coupling an output of the input phase adjustment circuit to the amplifier IC chip, and coupling an RF input port to one of the pair of inputs to select one of the pair of phase adjustment paths to adjust a phase of the RF signal in accordance with the selected phase adjustment path.

In yet another aspect, a device includes an RF input port to provide an RF signal, first and second amplifiers coupled to the RF input port, and an input phase adjustment circuit coupling the RF input port to the first and second amplifiers, the input phase adjustment circuit having first and second outputs coupled to the first and second amplifiers, respectively. The input phase adjustment circuit includes a pair of inputs for the first output and a pair of phase adjustment paths coupling the pair of inputs to the first output, respectively. The pair of phase adjustment paths are configured to adjust a phase of the RF signal differently for the first output.

In still another aspect, a Doherty amplifier includes an RF input port to provide an RF signal, a carrier amplifier coupled to the RF input port, a peaking amplifier coupled to the RF input port, and an input phase adjustment circuit coupling the RF input port to the carrier and peaking amplifiers. The input phase adjustment circuit has first and second outputs coupled to the carrier and peaking amplifiers, respectively. The input phase adjustment circuit includes, for each of the first and second outputs, a pair of inputs and a pair of phase adjustment paths coupled to the pair of inputs, respectively. For each of the carrier amplifier and the peaking amplifier, the RF input port is coupled to one of the pair of inputs pair to select one of the pair of phase adjustment paths and establish a respective phase adjustment of the RF signal.

The present invention is defined by the following claims and their equivalents, and nothing in this section should be taken as a limitation on those claims. Further aspects and advantages of the invention are discussed above in conjunction with the preferred embodiments and may be later claimed independently or in combination.

While the invention has been described above by reference to various embodiments, it should be understood that many changes and modifications may be made without departing from the scope of the invention. It is therefore intended that the foregoing detailed description be regarded as illustrative rather than limiting, and that it be understood that it is the following claims, including all equivalents, that are intended to define the spirit and scope of this invention.

The invention claimed is:

1. A device comprising:
   first, second, and third inputs, each configured to receive an RF signal;
   first and second amplifiers; and
   an input phase adjustment circuit coupling the first, second, and third inputs to the first and second amplifiers, the input phase adjustment circuit having first and second outputs coupled to the first and second amplifiers, respectively, the input phase adjustment circuit comprising:
   a pair of inputs for the first output, where the pair of inputs includes the first and second inputs;
   a first phase adjustment path coupling the first input to the first output, wherein the first phase adjustment path imparts a first phase delay to the RF signal conducted through the first phase adjustment path; and
   a second phase adjustment path coupling the second input to the first output, wherein the second phase adjustment path imparts a second phase delay to the RF signal conducted through the second phase adjustment path, and wherein the first and second phase delays are fixed and are different from each other by a multiple of 90 degrees.

2. The device of claim 1, wherein the input phase adjustment circuit comprises:
   a further pair of inputs for the second output, wherein the further pair of inputs includes the third input and a fourth input; and
   a further pair of phase adjustment paths coupling the further pair of inputs to the second output, respectively;
   wherein the further pair of phase adjustment paths are configured to adjust a phase of the RF signal for the second output differently.

3. The device of claim 1, wherein the first phase adjustment path comprises a delay element to effectuate at least a 90 degree phase adjustment of the RF signal.

4. The device of claim 1, wherein:
   an RF input port is coupled to the first input of the pair of inputs;
   the first input is coupled to the first phase adjustment path;
   the second input of the pair of inputs is electrically tied to ground and coupled to the second phase adjustment path; and
   the second phase adjustment path comprises a delay element to effectuate at least a 90 degree phase adjustment.

5. The device of claim 4, wherein:
   the first amplifier is configured as a carrier amplifier in a Doherty architecture; and
   the second amplifier is configured as a peaking amplifier in the Doherty architecture.

6. The device of claim 1, wherein:
   the first input of the pair of inputs is not coupled to an RF input port such that the first phase adjustment path is floating;
   the RF input port is coupled to the second input of the pair of inputs;
   the second input is coupled to the second phase adjustment path; and
   the second phase adjustment path comprises a delay element to effectuate a 90 degree phase adjustment.

7. The device of claim 1, wherein:
   the first amplifier is configured as a carrier amplifier in a Doherty architecture;
   the second amplifier is configured as a peaking amplifier in the Doherty architecture.

8. The device of claim 1, further comprising a third amplifier, wherein:
   the second amplifier is coupled to a second pair of phase adjustment paths of the input phase adjustment circuit;
   the third amplifier is coupled to a third pair of phase adjustment paths of the input phase adjustment circuit;
   the input phase adjustment circuit comprises a second pair of inputs for the second pair of phase adjustment paths;
   the input phase adjustment circuit comprises a third pair of inputs for the third pair of phase adjustment paths; and
   an RF input port is coupled to selected inputs of the pair of inputs for the first output, the second pair of inputs, and the third pair of inputs such that the first, second, and third amplifiers are disposed in a three-way Doherty architecture.

9. The device of claim 1, wherein:
   the input phase adjustment circuit comprises a first delay element coupled to the first output and a second delay element coupled to the first output via the first delay element;
   the first input of the pair of inputs is coupled to the first delay element to include the first delay element in the first phase adjustment path and bypass the second delay element; and
   the second input of the pair of inputs is coupled to the second delay element to include the first and second delay elements in the second phase adjustment path.

10. The device of claim 9, wherein:
    the first delay element is configured such that the first phase adjustment path has at least a 90 degree phase delay; and
    the first and second delay elements are configured such that the second phase adjustment path has at least a 180 degree phase delay.

11. The device of claim 9, wherein the first and second inputs are coupled to an RF input port and ground, respectively, such that the phase of the RF signal is adjusted via the first phase adjustment path to present at least a 90 degree phase delay.

12. The device of claim 9, wherein the first and second inputs are floating and coupled to an RF input port, respectively, such that the phase of the RF signal is adjusted via the first phase adjustment path to present at least a 180 degree phase delay.

13. A device comprising:
- a first integrated circuit assembly that comprises a first amplifier, an unconnected amplifier, and a first input phase adjustment circuit, wherein the first input phase adjustment circuit couples first and second inputs to the first amplifier;
- a second integrated circuit assembly that comprises a second amplifier and a third amplifier and a second input phase adjustment circuit, wherein the second input phase adjustment circuit couples third and fourth inputs to the second amplifier and couples a fifth input to the third amplifier; and
- the first input phase adjustment circuit and the second input phase adjustment circuit are configured to establish a three-way, inverted Doherty architecture in which:
  - at least a 180 degree phase delay is established for the first amplifier;
  - at least a 90 degree phase delay is established for the second amplifier; and
  - an effective 0 degree phase delay is established for the third amplifier.

14. A Doherty amplifier to amplify an RF signal, the Doherty amplifier comprising:
- a carrier amplifier;
- a peaking amplifier; and
- an input phase adjustment circuit coupled to the carrier and peaking amplifiers, the input phase adjustment circuit having first and second outputs coupled to the carrier and peaking amplifiers, respectively, the input phase adjustment circuit comprising:
  - a first pair of inputs;
  - a second pair of inputs;
  - a first pair of phase adjustment paths coupled to the first pair of inputs and to the first output; and
  - a second pair of phase adjustment paths coupled to the second pair of inputs and to the second output;
- wherein, for the carrier amplifier, the RF signal is provided to only one input of the first pair of inputs to select one of the first pair of phase adjustment paths and establish a first phase adjustment of the RF signal between the one input of the first pair of inputs and the first output, and for the peaking amplifier, the RF signal is provided to only one input of the second pair of inputs to select one of the second pair of phase adjustment paths and establish a second phase adjustment of the RF signal between the one input of the second pair of inputs and the second output, and wherein the first and second phase adjustments are different from each other by a multiple of 90 degrees.

15. The Doherty amplifier of claim 14, wherein each pair of phase adjustment paths comprises a path configured to introduce at least a 90 degree phase shift.

16. The Doherty amplifier of claim 15, further comprising a phase delay element disposed between the RF input port and the input of the pair of inputs for the first output and coupled to the path configured to introduce the at least 90 degree phase shift, wherein the phase delay element is configured to introduce a further at least 90 degree phase shift.

17. The Doherty amplifier of claim 14, wherein, for each output of the first and second outputs:
- the input phase adjustment circuit comprises a first delay element coupled to the output and a second delay element coupled to the output via the first delay element;
- a first input of the pair of inputs is coupled to the first delay element to include the first delay element in a first phase adjustment path of the pair of phase adjustment paths and bypass the second delay element; and
- a second input of the pair of inputs is coupled to the second delay element to include the first and second delay elements in a second adjustment path of the pair of phase adjustment paths.

18. A method of fabricating an amplifier, the method comprising:
- providing an amplifier die;
- providing an input phase adjustment circuit that comprises a first input, a second input, an output, a first phase adjustment path coupling the first input to the output, and a second phase adjustment path coupling the second input to the output;
- coupling the output of the input phase adjustment circuit to the amplifier die; and
- coupling an RF input port to only one of the first or second inputs to couple one of the first or second phase adjustment paths between the only one of the first or second inputs and the output of the input phase adjustment circuit so that the amplifier is configured to adjust a phase of an RF signal received at the only one of the first or second inputs by a phase delay that the first or second phase adjustment path is configured to present, and wherein first and second phase delays imparted by the first and second phase adjustment paths are fixed and are different from each other by a multiple of 90 degrees.

19. The method of claim 18, further comprising coupling the other one of the first or second inputs to ground, wherein:
- the phase adjustment path to which the other one of the first or second inputs is coupled is configured to present at least a 90 degree phase shift; and
- coupling the output comprises connecting the output to a carrier amplifier on the amplifier die.

* * * * *